US010838306B2

(12) United States Patent
Schoenhoff (10) Patent No.: US 10,838,306 B2
(45) Date of Patent: Nov. 17, 2020

(54) OPTICAL SYSTEM, IN PARTICULAR FOR A MICROLITHOGRAPHIC PROJECTION EXPOSURE APPARATUS

(71) Applicant: Carl Zeiss SMT GmbH, Oberkochen (DE)

(72) Inventor: Ulrich Schoenhoff, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/968,270

(22) Filed: May 1, 2018

(65) Prior Publication Data

US 2018/0246416 A1 Aug. 30, 2018

Related U.S. Application Data

(63) Continuation of application No. PCT/EP2016/080498, filed on Dec. 9, 2016.

(30) Foreign Application Priority Data

Dec. 15, 2015 (DE) .................. 10 2015 225 262

(51) Int. Cl.
*G03F 7/20* (2006.01)
*G02B 5/122* (2006.01)
(Continued)

(52) U.S. Cl.
CPC ......... *G03F 7/70258* (2013.01); *G02B 5/122* (2013.01); *G02B 17/004* (2013.01);
(Continued)

(58) Field of Classification Search
CPC .. G02B 5/122; G02B 17/004; G02B 19/0047; G02B 19/0095; G02B 27/0068; G03F 7/70258; G03F 7/70825; G03F 7/70316
See application file for complete search history.

(56) References Cited

U.S. PATENT DOCUMENTS 6,552,775 B1 4/2003 Yanagihara et al.
6,842,294 B2 1/2005 Holderer et al.
(Continued)

FOREIGN PATENT DOCUMENTS

DE 102 04 465 A1 8/2003
DE 10 2010 038 748 A1 3/2011
(Continued)

OTHER PUBLICATIONS

German Office Action, with translation thereof, for corresponding DE 10 2015 225 262.0, dated Sep. 1, 2016.
(Continued)

*Primary Examiner* — Deoram Persaud
(74) *Attorney, Agent, or Firm* — Fish & Richardson P.C.

(57) ABSTRACT

A microlithographic projection exposure apparatus optical 22 system includes a first reflective surface and at least one second reflective surface, each in the optical beam path. The first reflective surface is movable for the correction of an aberration that occurs during the operation of the optical system. The optical system is configured in so that, during the travel movement of the first reflective surface, the relative position of the first reflective surface and of the second reflective surface is maintainable in a stable manner. Either the first reflective surface and the second reflective surface directly succeed one another in the optical beam path, or there are only reflective optical elements between the first reflective surface and the second reflective surface.

20 Claims, 9 Drawing Sheets

(51) Int. Cl.
  *G02B 17/00* (2006.01)
  *G02B 19/00* (2006.01)
  *G02B 27/00* (2006.01)

(52) U.S. Cl.
  CPC ..... *G02B 19/0047* (2013.01); *G02B 19/0095* (2013.01); *G02B 27/0068* (2013.01); *G03F 7/70316* (2013.01); *G03F 7/70825* (2013.01)

(56) References Cited

U.S. PATENT DOCUMENTS

| | | | |
|---|---|---|---|
| 6,943,965 B2 | 9/2005 | Kohl et al. | |
| 7,538,856 B2 | 5/2009 | Kajiyama et al. | |
| 9,606,339 B2 | 3/2017 | Hetzler et al. | |
| 9,846,375 B2 | 12/2017 | Hartjes | |
| 2002/0085276 A1* | 7/2002 | Tanitsu | G03F 7/70075 359/432 |
| 2004/0227107 A1* | 11/2004 | Cox | G03F 7/709 250/548 |
| 2004/0227915 A1 | 11/2004 | Ohtsuka | |
| 2005/0122495 A1 | 6/2005 | Kaplan et al. | |
| 2006/0215133 A1 | 9/2006 | Hazelton | |
| 2007/0195317 A1 | 8/2007 | Schottner et al. | |
| 2007/0280609 A1* | 12/2007 | Ito | G02B 7/023 385/94 |
| 2009/0174876 A1* | 7/2009 | Schriever | G03F 7/70825 355/69 |
| 2009/0213352 A1* | 8/2009 | Goehnermeier | G02B 27/0068 355/67 |
| 2009/0244509 A1* | 10/2009 | Limbach | G02B 7/004 355/67 |
| 2011/0001945 A1 | 1/2011 | Shiraishi | |
| 2012/0162620 A1 | 6/2012 | Hendricus et al. | |
| 2012/0162626 A1 | 6/2012 | Krebs et al. | |
| 2014/0168623 A1* | 6/2014 | Hoshino | G03F 7/70191 355/67 |

FOREIGN PATENT DOCUMENTS

| | | |
|---|---|---|
| DE | 10 2012 202 675 A1 | 1/2013 |
| DE | 10 2012 212 064 A1 | 1/2014 |
| JP | 2001-215718 A | 8/2001 |
| JP | 2004-266264 A | 9/2004 |
| JP | 2004-343078 A | 12/2004 |
| JP | 2005-527848 A | 9/2005 |
| JP | 2006-140366 A | 6/2006 |
| JP | 2011-014908 A | 1/2011 |
| TW | 201229682 A | 7/2012 |
| WO | WO 2008/126925 A1 | 10/2008 |
| WO | WO 2015/014753 | 2/2015 |

OTHER PUBLICATIONS

International Search Report and Written Opinion for corresponding Appl No. PCT/EP2016/080498, dated Apr. 11, 2017.
International Preliminary Report on Patentability for corresponding Appl No. PCT/EP2016/080498, dated Jun. 28, 2018.
TIPO—Office Action and Search Report, with English translation, for corresponding TW Appl No. 105141037, dated Feb. 13, 2020.
Japan Patent Office, Notification of Reasons for Refusal, including English Translation, issued in related JP Patent Application No. 2018-526111, dated Sep. 1, 2020.

* cited by examiner

OPTICAL SYSTEM, IN PARTICULAR FOR A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2016/080498, filed Dec. 9, 2016, which claims benefit under 35 USC 119 of German Application No. 10 2015 225 262.0 filed on Dec. 15, 2015. The entire disclosure of these applications are incorporated by reference herein.

FIELD

The disclosure relates to an optical system, in particular for a microlithographic projection exposure apparatus.

BACKGROUND

Microlithography is used for producing microstructured components, such as integrated circuits or LCDs, for example. The microlithography process is carried out in a so-called projection exposure apparatus including an illumination device and a projection lens. The image of a mask (reticle) illuminated via the illumination device is in this case projected via the projection lens onto a substrate (for example a silicon wafer) coated with a light-sensitive layer (photoresist) and arranged in the image plane of the projection lens, in order to transfer the mask structure to the light-sensitive coating of the substrate.

In projection lenses designed for the EUV range, i.e. at wavelengths of e.g. approximately 13 nm or approximately 7 nm, owing to the general lack of availability of suitable light-transmissive refractive materials, mirrors are used as optical components for the imaging process. Typical projection lenses designed for EUV, as known, for example, from U.S. Pat. No. 7,538,856 B2, may have for example an image-side numerical aperture (NA) in the range of NA=0.2 to 0.3 and image an (e.g. annular) object field into the image plane or wafer plane.

It is known here, inter alia, for the correction of optical aberrations, to configure mirrors within the projection lens such that they are actively manipulatable, in order to achieve a position manipulation in up to six degrees of freedom and an associated manipulation or correction of aberrations. One issue that can occur here, in practice, however, is that a position manipulation (e.g. a travel movement or tilting) of a mirror within the projection lens is simultaneously accompanied by a movement of the image obtained in the wafer plane. This issue can be all the more serious because the sensitivity of the undesired reaction of the image position to mirror movements is relatively high in comparison with the desired manipulation of the aberrations with respect to the mirror movements, which holds true in particular for mirror movements taking place in the so-called degrees of freedom of tilting.

A further challenge in practice is that a correction of aberrations by way of a position manipulation of one or more mirrors in the projection lens is also desirable during the microlithographic exposure process, such that the issue described above cannot, in general, simply be rectified by adapting the wafer position in pauses in the exposure process.

With regard to the prior art, reference is made, merely by way of example, to U.S. Pat. No. 6,842,294 B2, DE 10 2012 212 064 A1, DE 10 2010 038 748 A1 and WO 2008/126925 A1.

SUMMARY

The disclosure seeks to provide an optical system, in particular for a microlithographic projection exposure apparatus, which enables the correction of aberrations in particular also during the microlithographic exposure process, without the problems described above.

The disclosure provides an optical system, in particular for a microlithographic projection exposure apparatus, that includes: a first reflective surface, which is arranged in the optical beam path of the optical system and is movable for the correction of an aberration that occurs during the operation of the optical system; and at least one second reflective surface, arranged in the optical beam path of the optical system; wherein the optical system is configured in such a way that during the travel movement of the first reflective surface, the relative position of the first reflective surface and of the second reflective surface with respect to one another is maintainable in a stable manner; and wherein either the first reflective surface and the second reflective surface directly succeed one another in the optical beam path or there are only reflective optical elements between the first reflective surface and the second reflective surface.

In this case, within the meaning of the present application, the criterion according to which, during the travel movement of the first reflective surface, the relative position of the first reflective surface and of the second reflective surface with respect to one another is maintainable in a stable manner should be understood to mean that no image movement relevant to the exposure is caused. Preferably, in this case, the relative position of the first and second reflective surfaces is constant apart from a maximum change or fluctuation in the angle between these surfaces of 16 picorad (prad).

The disclosure is based on the concept, in particular, of keeping at least two reflective surfaces in a stable or substantially constant relative position with respect to one another, in order to obtain a travel movement carried out for the purpose of the correction of aberrations without an undesired image shift (e.g. on the wafer plane in a projection lens of a projection exposure apparatus).

A particular advantageous application example of the disclosure is a scenario in which a correction of aberrations by way of a position manipulation of a mirror is performed during the microlithographic exposure process, which can be realized according to the disclosure without performing a correction of image movement/shift on the wafer plane using a further mirror.

In accordance with one embodiment, the optical system includes a first control loop for controlling the common position of the first reflective surface and of the second reflective surface in relation to a reference position. In this case, common position is understood to mean the average position (i.e. the average position) of the positions of the first and second surfaces. In a further embodiment, the optical system includes a first control loop for controlling the relative position of the first reflective surface in relation to a reference position.

In accordance with one embodiment, the optical system includes a second control loop for controlling the relative position of the first reflective surface and of the second reflective surface with respect to one another.

In accordance with one embodiment, the control in the first control loop is carried out on the basis of sensor signals of at least one first sensor, and the control in the second control loop is carried out on the basis of sensor signals of at least one second sensor, wherein the first sensor has a lower sensitivity and a greater measurement range than the second sensor. In each case a plurality of sensors can also be provided here for the first and/or second control loop, which sensors measure jointly in a plurality of degrees of freedom.

In accordance with one embodiment, the control in the second control loop is carried out on the basis of sensor signals of at least one sensor that measures the relative position of the first reflective surface and the second reflective surface with respect to one another. The disclosure is, however, not restricted thereto. In further embodiments, it is also possible to measure the position of each of the first reflective surface and the second reflective surface relative to a (common) reference object or reference surface.

In accordance with one embodiment, the first reflective surface and the second reflective surface are mechanically rigidly coupled to one another.

In accordance with one embodiment, the first reflective surface and the second reflective surface are embodied monolithically.

In accordance with one embodiment, the first reflective surface and the second reflective surface are embodied on separate mirror bodies.

In accordance with one embodiment, the first reflective surface and the second reflective surface directly succeed one another in the optical beam path.

The disclosure is, however, not restricted thereto. In further embodiments, at least one reflective optical element is arranged in the optical beam path between the first reflective surface and the second reflective surface. In particular, the disclosure also includes embodiments in which the first reflective surface and the second reflective surface—although not directly succeeding one another in the optical light path, are arranged in a small spatial distance from each other (e.g. due to an optical light path that runs from the first reflective surface forward to one or more further optical elements and then back to the second reflective surface).

In accordance with one embodiment, the first reflective surface and/or the second reflective surface are/is arranged in such a way that reflection angles which occur during the operation of the optical system upon the reflection of electromagnetic radiation at the respective surface, the reflection angles being relative to the respective surface normal, are at least 55°, in particular at least 60°, more particularly at least 65°.

In other words, in embodiments, at least one of the reflective surfaces can be operated with grazing incidence. The mirrors having such a reflective surface are also referred to for short as GI mirrors (="grazing incidence"), wherein the use thereof is desirable, in principle, with regard to the comparatively high achievable reflectivities (of e.g. 80% or more). In addition, in a corresponding optical system, the distance between successive GI mirrors is sometimes comparatively small, and so the disclosure (for instance in the case of rigid mechanical coupling between the first and second reflective surfaces) can be realized particularly advantageously in such a system.

However, the disclosure is not restricted to a realization in conjunction with GI mirror(s), such that, in particular, at least one of the two reflective surfaces can also be operated with normal incidence.

In accordance with one embodiment, the first reflective surface and/or the second reflective surface are/is aspherical. In this way it is possible, on the one hand, to achieve an effective correction of aberrations and, on the other hand, at least to a good approximation, furthermore to avoid an image shift on the wafer plane.

In accordance with one embodiment, the travel movement of the first reflective surface is able to be carried out during the operation of the optical system.

In accordance with one embodiment, the optical system is designed for an operating wavelength of less than 30 nm, in particular for an operating wavelength of less than 15 nm. However, the disclosure is not restricted thereto, but rather can also be realized advantageously e.g. at wavelengths in the DUV range (e.g. of less than 250 nm).

In accordance with one embodiment, the optical system is an illumination device or a projection lens of a microlithographic projection exposure apparatus.

The disclosure furthermore relates to a microlithographic projection exposure apparatus, including an illumination device and a projection lens, wherein the illumination device, during the operation of the projection exposure apparatus, illuminates a mask situated in an object plane of the projection lens and the projection lens images structures on the mask onto a light-sensitive layer situated in an image plane of the projection lens, wherein the projection exposure apparatus includes an optical system having the features described above.

The disclosure furthermore also relates to a method for the operation of an optical system, in particular of a microlithographic projection exposure apparatus, wherein the optical system includes a first reflective surface and at least one second reflective surface in the optical beam path, wherein the first reflective surface is moved for the correction of an aberration that occurs during the operation of the optical system, and wherein, during the travel movement, the relative position of the first reflective surface and of the second reflective surface with respect to one another is kept stable, wherein either the first reflective surface and the second reflective surface directly succeed one another in the optical beam path or there are only reflective optical elements between the first reflective surface and the second reflective surface.

In accordance with one embodiment, the relative position of the first reflective surface in relation to a reference position is controlled in a first control loop.

In accordance with one embodiment, the relative position of the first reflective surface and of the second reflective surface with respect to one another is controlled in a second control loop.

In accordance with one embodiment, the first reflective surface and the second reflective surface are mechanically rigidly coupled to one another.

Further configurations of the disclosure may be gathered from the description and the dependent claims.

BRIEF DESCRIPTION OF THE DRAWINGS

The disclosure is explained in greater detail below on the basis of exemplary embodiments illustrated in the accompanying figures, in which.

DETAILED DESCRIPTION OF PREFERRED EMBODIMENTS

Figure 1:
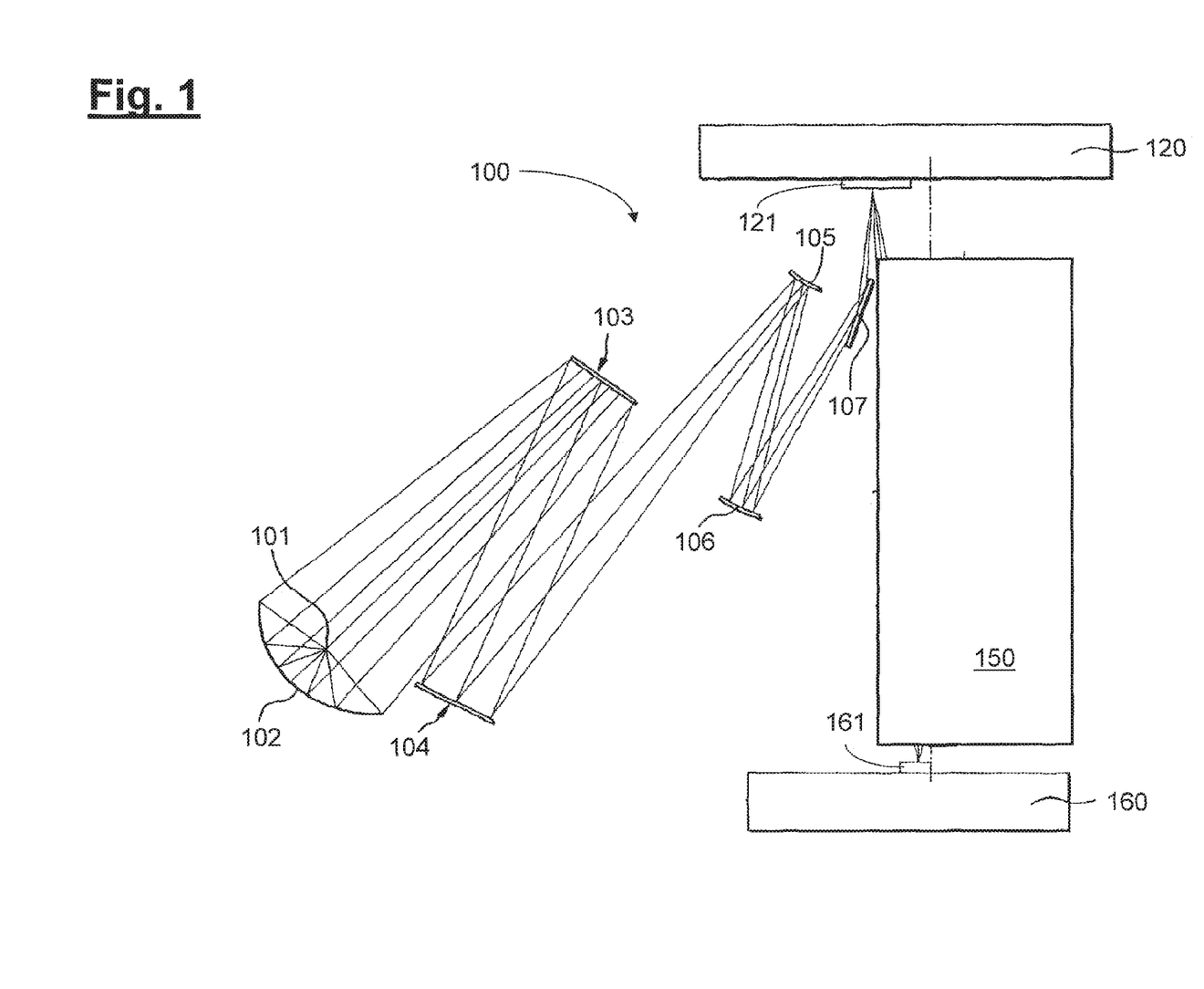
FIG. 1 shows a schematic illustration of a projection exposure apparatus designed for operation in the EUV.

FIG. 1 firstly shows a schematic illustration of an exemplary projection exposure apparatus which is designed for operation in the EUV and in which the present disclosure can be realized.

According to FIG. 1, an illumination device in a projection exposure apparatus 100 designed for EUV includes a field facet mirror 103 and a pupil facet mirror 104. The light from a light source unit including a plasma light source 101 and a collector mirror 102 is directed onto the field facet mirror 103. A first telescope mirror 105 and a second telescope mirror 106 are arranged in the light path downstream of the pupil facet mirror 104. A deflection mirror 107 is arranged downstream in the light path and directs the radiation impinging on it onto an object field in the object plane of a projection lens 150, which is merely indicated in FIG. 1. A reflective structure-bearing mask 121 on a mask stage 120 is arranged at the location of the object field, the mask being imaged into an image plane with the aid of the projection lens 150, a substrate 161 coated with a light-sensitive layer (photoresist) on a wafer stage 160 being situated in the image plane.

According to the disclosure, then, in embodiments of the disclosure, the projection exposure apparatus or the projection lens can be configured in such a way that two reflective surfaces or mirrors are mechanically rigidly coupled to one another, in particular are realized on one and the same mirror body, as described below with reference to FIGS. 2B-2C and FIG. 3, in order to be able to carry out a rotational movement—effected for the purpose of correction of aberrations—of the reflective surfaces about a predefined axis of rotation, without this being accompanied by an undesired image movement on the wafer plane.

In further embodiments, even in the case of two reflective surfaces or mirrors configured in a manner spatially separated from one another, via the realization of two control loops, described in even greater detail below with reference to FIG. 4, of which control loops one controls or minimizes the relative movement of the two reflective surfaces and the other controls a common rotational movement of the reflective surfaces that serves once again for the correction of aberrations, it is possible to obtain no undesired image shift on the wafer plane in conjunction with a low outlay in terms of control engineering.

Firstly, however, the concept underlying the disclosure will be described below with reference to the schematic depictions in FIGS. 2A-2C and FIGS. 3-4.

Figure 2A:
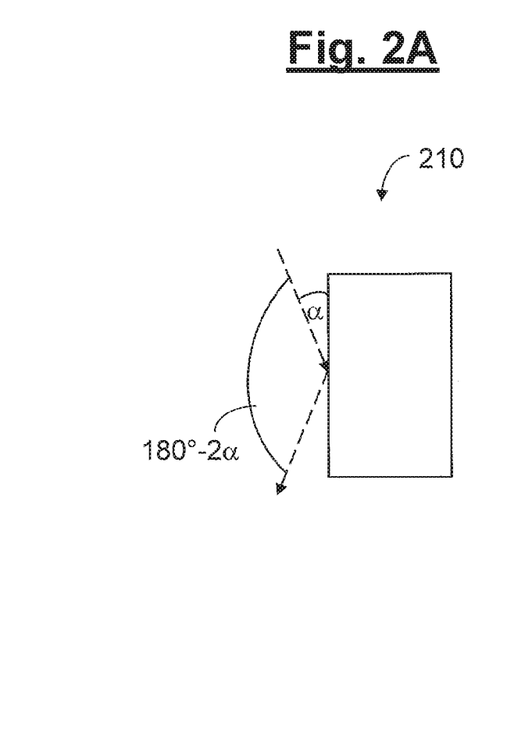
FIGS. 2A-2C, 3 and 4 show schematic illustrations for elucidating the basic principle and the mode of action of the present disclosure.
Figure 2B:
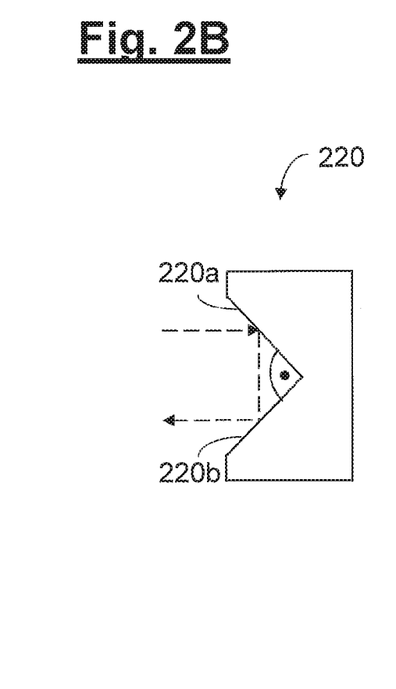
Figure 2C:
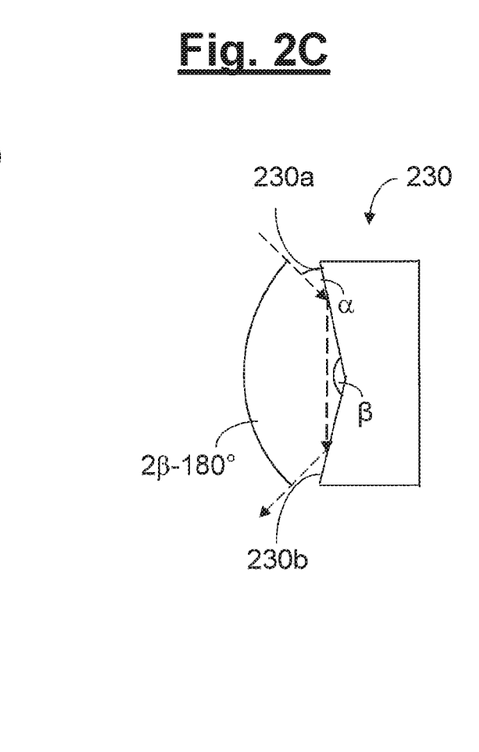

The schematic depictions in FIGS. 2A-2C serve firstly for clarifying the functional principle of a retroreflector, this principle being known as such:

In contrast to a simple plane mirror 210 (FIG. 2A), which, upon tilting relative to the direction of an incident light beam, exhibits a sensitive reaction of the direction of the respectively reflected light beam, with a retroreflector 220 having two reflective surfaces 220a, 220b arranged at a fixed angle (90° in the example) relative to one another in accordance with FIG. 2B, what can be achieved is that the direction of the beam reflected at the second reflective surface is maintained independently of the direction of incidence upon impinging on the first reflective surface 220a.

This maintenance of the direction of the light beam reflected at the second reflective surface is not restricted to a right-angled arrangement of the two reflective surfaces (i.e. a resulting 180° reflection), but rather is also fulfilled in arrangements having a different (constant) angle between two surfaces which successively reflect the respective light beam. Consequently, even during a movement of the mirror body 230 having the two reflective surfaces 230a, 230b, the mirror body being illustrated in FIG. 2C, the direction of the respective emerging light beam (i.e. reflected at the second reflective surface 230b) for one and the same direction of incidence of the light beam before the latter impinges on the first reflective surface 230a is maintained or remains constant.

On the basis of the above considerations, the disclosure then includes the concept, in particular, of realizing two reflective surfaces within the projection lens such that their relative position with respect to one another remains unchanged during the lithography process. This can be achieved in particular (but without the disclosure being restricted thereto) by the two reflective surfaces being mechanically rigidly coupled to one another or being realized monolithically on one and the same mirror body, as described below with reference to the exemplary embodiment illustrated in FIG. 3.

Figure 3:
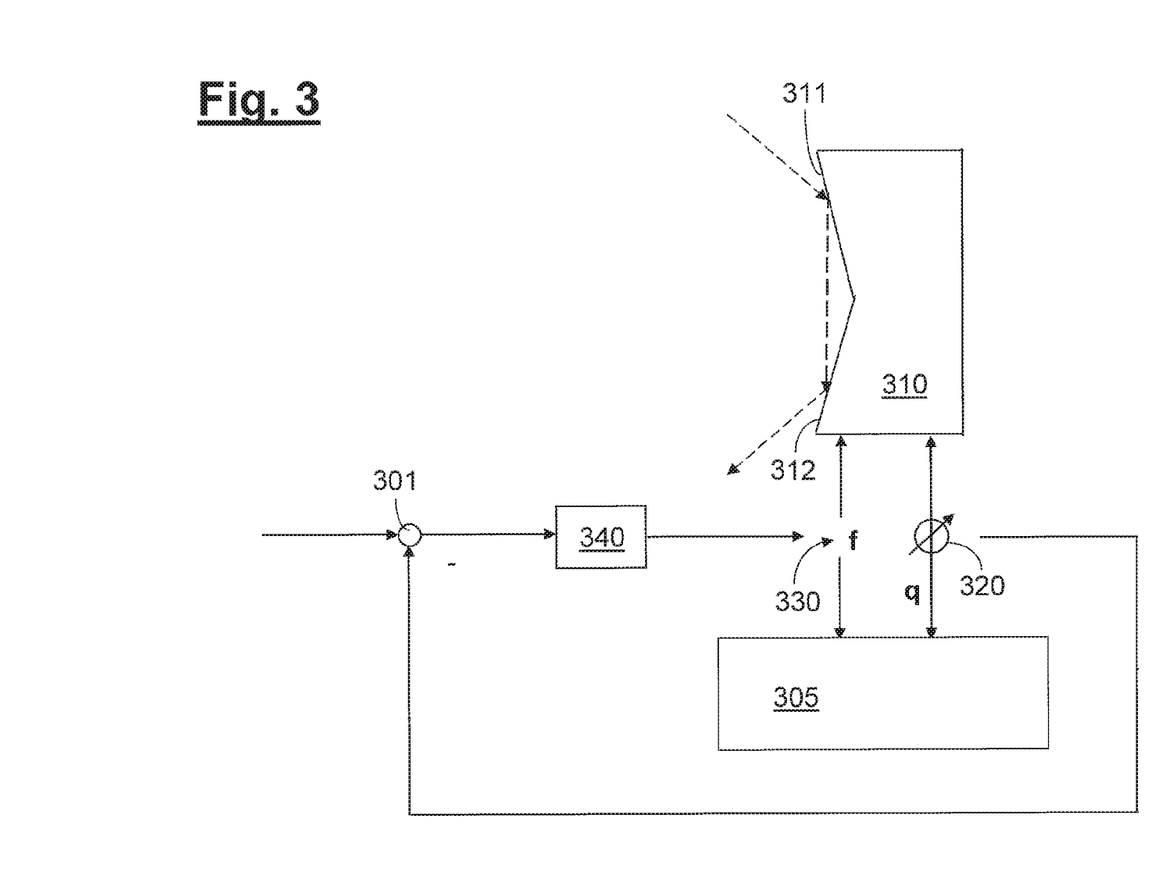

FIG. 3 shows, for the realization of the concept described above, the configuration of a mirror body 310 having two reflective surfaces 311, 312, at which—as indicated schematically in FIG. 3—a light beam impinging during operation experiences in each case two successive reflections (wherein, as described above, the position of the image generated in a downstream image plane or the wafer plane of the projection lens having the mirror remains unchanged independently of a movement of the mirror body 310).

FIG. 3 likewise illustrates a control loop in which the position of the mirror body 310 having the two reflective surfaces 311, 312 is measured relative to a frame 305 via a position sensor 320 and is set to the desired value (corresponding to a setpoint position value 301) via a controller 340 via an actuator 330. Position sensor 320, actuator 330 and controller 340 act only in one degree of freedom in the basic schematic diagram in FIG. 3, namely with regard to a rotational movement about an axis of rotation running perpendicular to the plane of the drawing. In the technical realization, typically a plurality of degrees of freedom can be manipulated simultaneously.

In further embodiments, it is also possible to provide a plurality of position sensors 320 for measuring a plurality of degrees of freedom.

The circumstance that the image position ultimately generated on the wafer plane is maintained independently of a movement of the mirror body 310 carried out for the purpose of correction of aberrations has the consequence that the position sensor 320 (or the position sensors) involves/involve a comparatively low measurement accuracy, which in particular is significantly lower in comparison with the measurement accuracy of an analogously used position sensor which would have to ensure the stability of the image position in the case of the movement of a single reflective surface.

In other words, for the functionality of the position sensor 320 it suffices to carry out a comparatively coarse position measurement with regard to the positioning of the mirror body 310 for influencing aberrations, wherein although this position measurement should have a large measurement range (of e.g. 50 µm) designed according to the positioning for influencing aberrations, it nonetheless involves a measurement accuracy lower by a plurality of orders of magnitude in comparison with a position sensor that ensures image stability upon reflection at only one moved reflective surface.

As a result, this leads to a considerable reduction of the outlay in terms of sensor technology and control engineering, as a result of which in turn the desired properties of the structure-dynamic design of the mirror body 310, of the actuator 330 and of the frame 305 in the set-up in accordance with FIG. 3 are reduced.

As already mentioned, the disclosure is not restricted to the realization of two successive reflections or reflective surfaces on one and the same mirror body or to an otherwise realized rigid mechanical connection of the relevant reflective surfaces. Rather, in further embodiments, the relative position of two separate mirror bodies each having a reflective surface, which mirror bodies are not rigidly connected to one another, can also be correspondingly controlled in a suitable control loop. In this case, too, major advantages are afforded with regard to the outlay in terms of sensor technology and control engineering, as will be explained in greater detail below with reference to FIG. 4.

Figure 4:
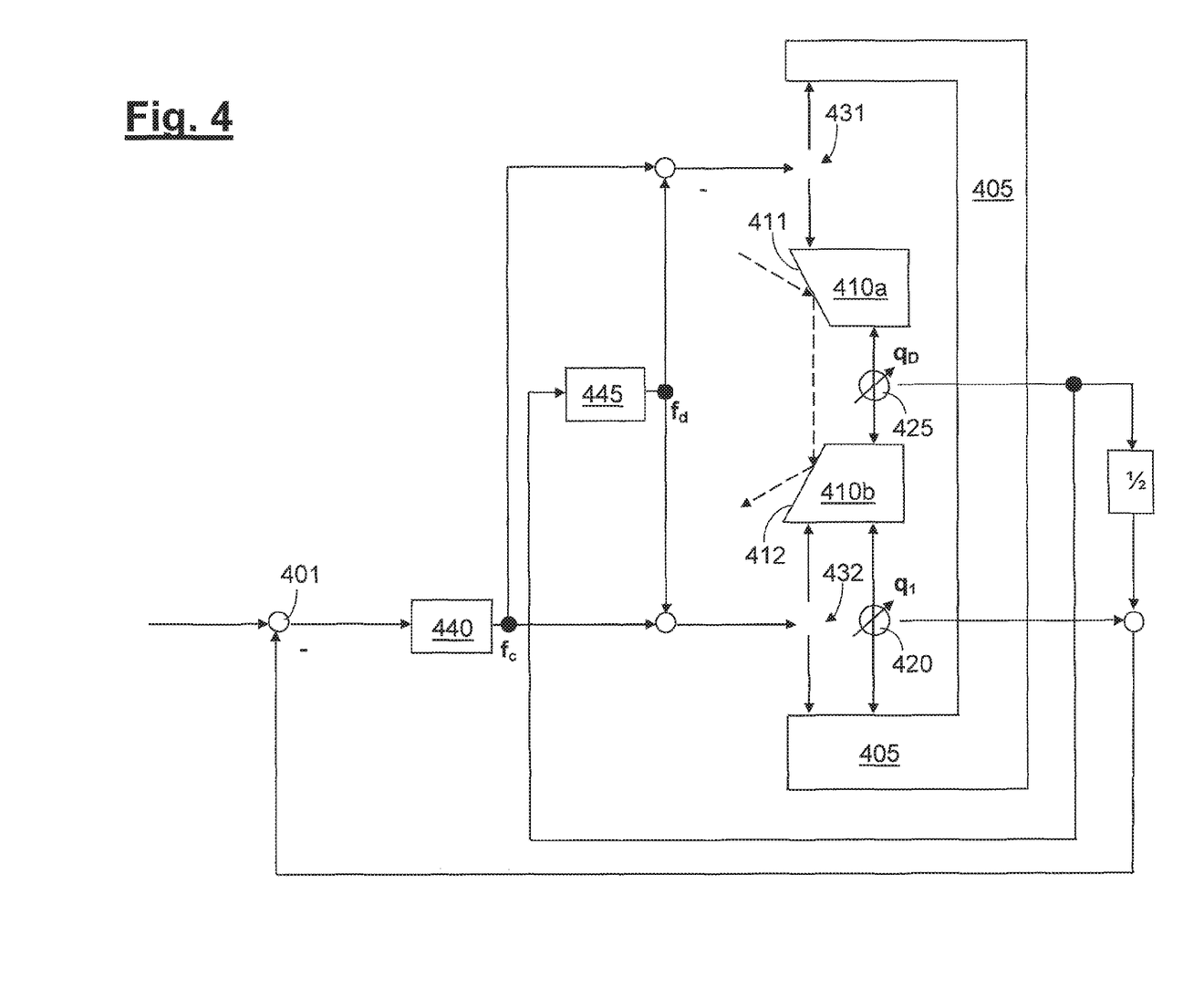

FIG. 4 shows two separate mirror bodies 410a, 410b, each having a reflective surface 411 and 412, respectively, the mirror bodies not being mechanically rigidly connected to one another. The relative position of the two mirror bodies 410a, 410b with respect to one another is determined via a relative sensor 425. Although the relative sensor 425 involves a comparatively high measurement accuracy (since a relative movement between the two mirror bodies 410a, 410b or the reflective surfaces 411, 412 with respect to one another would lead directly to a significant image movement), in return the relative sensor does not involve a large measurement range (since the reflective surfaces 411, 412 are intended to remain positioned continuously at the same angle with respect to one another).

On the basis of the measurement signals of the relative position sensor 425, in a control loop with controller 445, the relative position of the two mirror bodies 410a, 410b or of the two reflective surfaces 411, 412 is controlled using a relative controller 445 and using actuators 431, 432 assigned to the respective mirror bodies 410a, 410b. The actuators 431, 432 here are driven in each case such that—for instance in the case of an undesired movement of the mirror bodies 410a, 410b away from one another—a force is applied with which the mirror bodies 410a, 410b are moved towards one another again.

If the force exerted by the first actuator 431 is designated by $f_1$, the force exerted by the second actuator 432 is designated by $f_2$, the manipulated variable or force of the common control loop is designated by $f_c$ and the manipulated variable of the differential control loop is designed by $f_d$, then it holds true that:

$$f_1 = f_c + f_d \quad (1)$$

$$f_2 = f_c - f_d \quad (2)$$

In addition to this control loop with controller 445 (responsible for the relative position between the two mirror bodies 410a, 410b), in accordance with FIG. 4 a superordinate control loop with controller 440 is realized, which controls the common or average position of the two mirror bodies 410a and 410b relative to an outer frame 405. "401" designates a setpoint position value. In this case, it holds true that:

$$q_c = q_1 + \tfrac{1}{2} * q_d \quad (3)$$

wherein $q_1$ denotes the position of the first mirror body 410a, $q_c$ denotes the common position of the two mirror bodies 410a and 410b, and $q_d$ denotes the differential position of the two mirror bodies 410a and 410b.

The superordinate control loop with controller 440 in turn involves (in this respect analogously to the exemplary embodiment from FIG. 3) a sensor having a large measurement range, but in conjunction with only a low measurement accuracy (since here e.g. a tilting of the mirror bodies 410a, 410b for the purpose of the manipulation of aberrations are determined with a comparatively low accuracy, but over a large measurement range of e.g. 50 µm).

The disclosure is not restricted to the concrete arrangement of the actuators as illustrated in FIG. 4. In further embodiments, e.g. it is also possible for one of the actuators to act between the two mirror bodies 410a, 410b, and the other actuator between one of the mirror bodies 410a, 410b and the frame 405.

As a result, the properties in terms of sensor technology and control engineering which are applicable in each case in the two control loops for the realization of the exemplary embodiment of FIG. 4 (in particular of a sensor having a high measurement accuracy over a comparatively small measurement range, and of a further sensor having a low measurement accuracy over a comparatively large measurement range) can also be fulfilled comparatively simply.

FIGS. 5A-5D show schematic illustrations for elucidating further embodiments of the disclosure, wherein the same components or components which have the same function are designated with reference numbers increased by "100" with respect to FIG. 4.

Figure 5A:
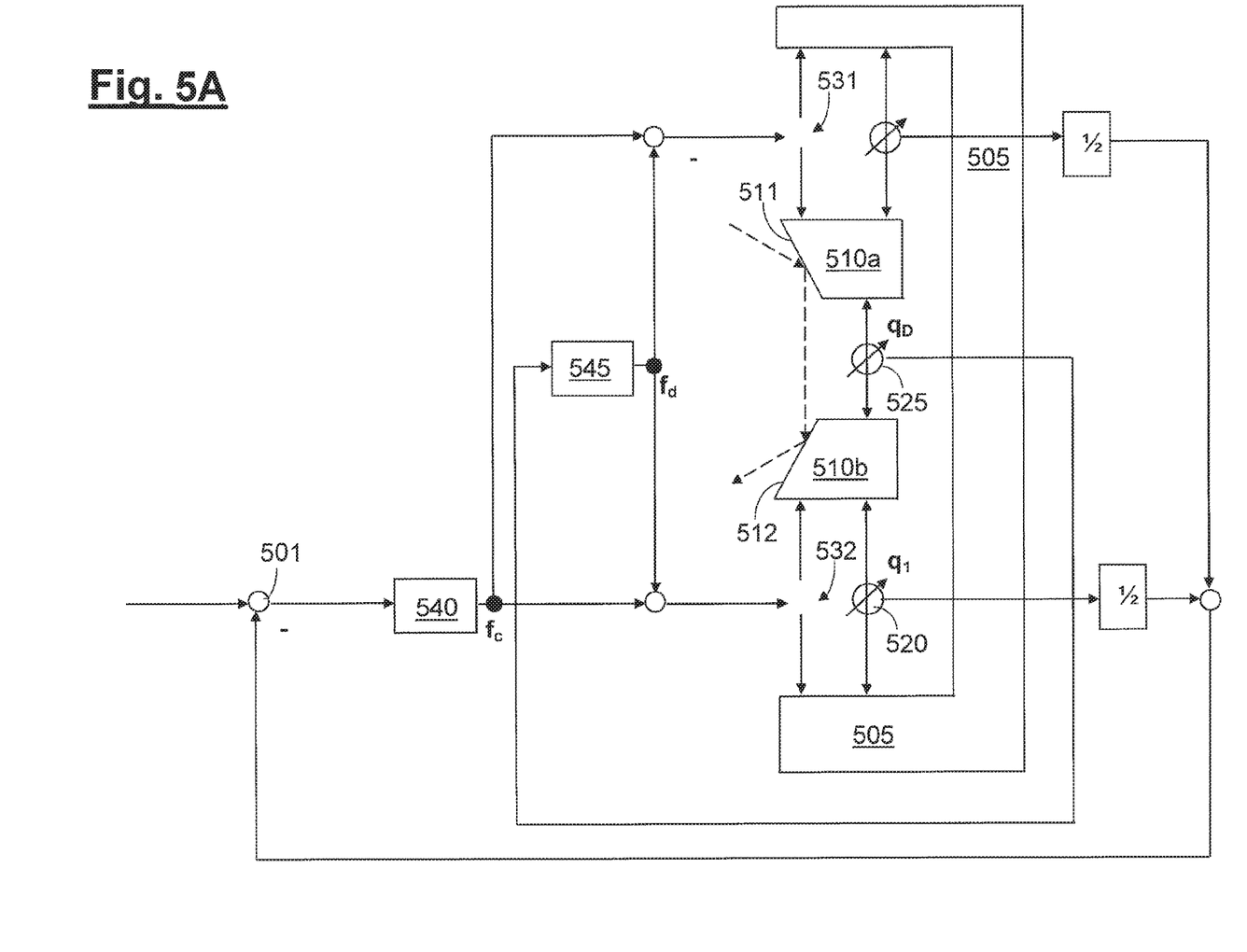
FIGS. 5A-5D show schematic illustrations for elucidating further embodiments of the disclosure.

The embodiment of FIG. 5A differs from that of FIG. 4 insofar as—instead of measuring the position of only one mirror body in relation to the outer frame—the average positions of both mirror bodies 510a and 510b are determined, and used as a basis for the respective superordinate control loop with controller 540 which controls the average position of the two mirror bodies 510a and 510b relative to the outer frame 505. "501" designates a setpoint position value.

Figure 5B:
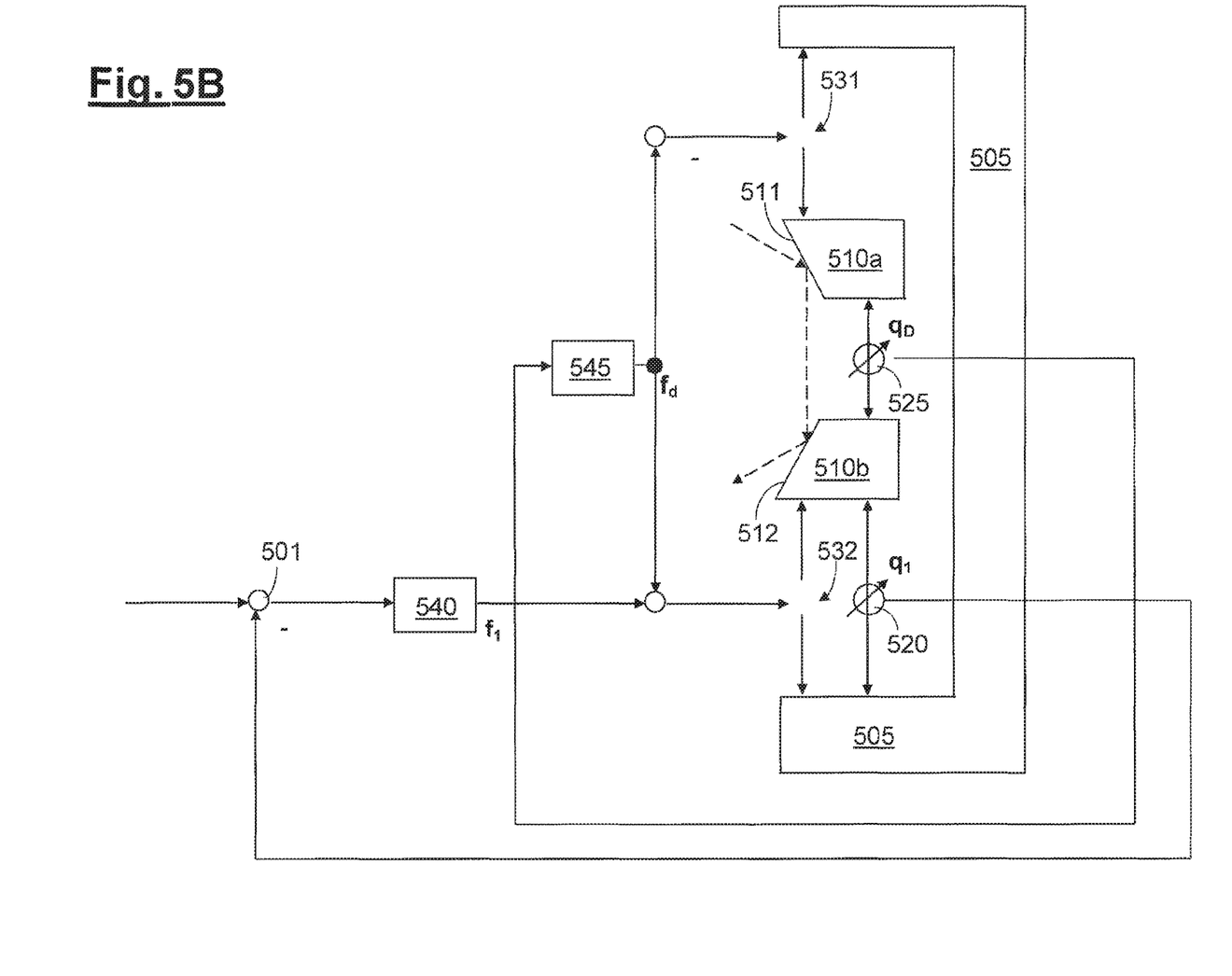

According to FIG. 5B, as to the control loop with controller 545 in FIG. 5B, measuring of the relative position of mirror bodies 510a and 510b as well as the respective control are analogously to FIG. 4. In contrast to FIG. 4, the position of one mirror body 510b is measured in relation to the outer frame 505 and used as a basis for the control loop with controller 540. This controls the position of mirror body 510b. The position of mirror body 510a is indirectly controlled by controller 545.

Figure 5C:
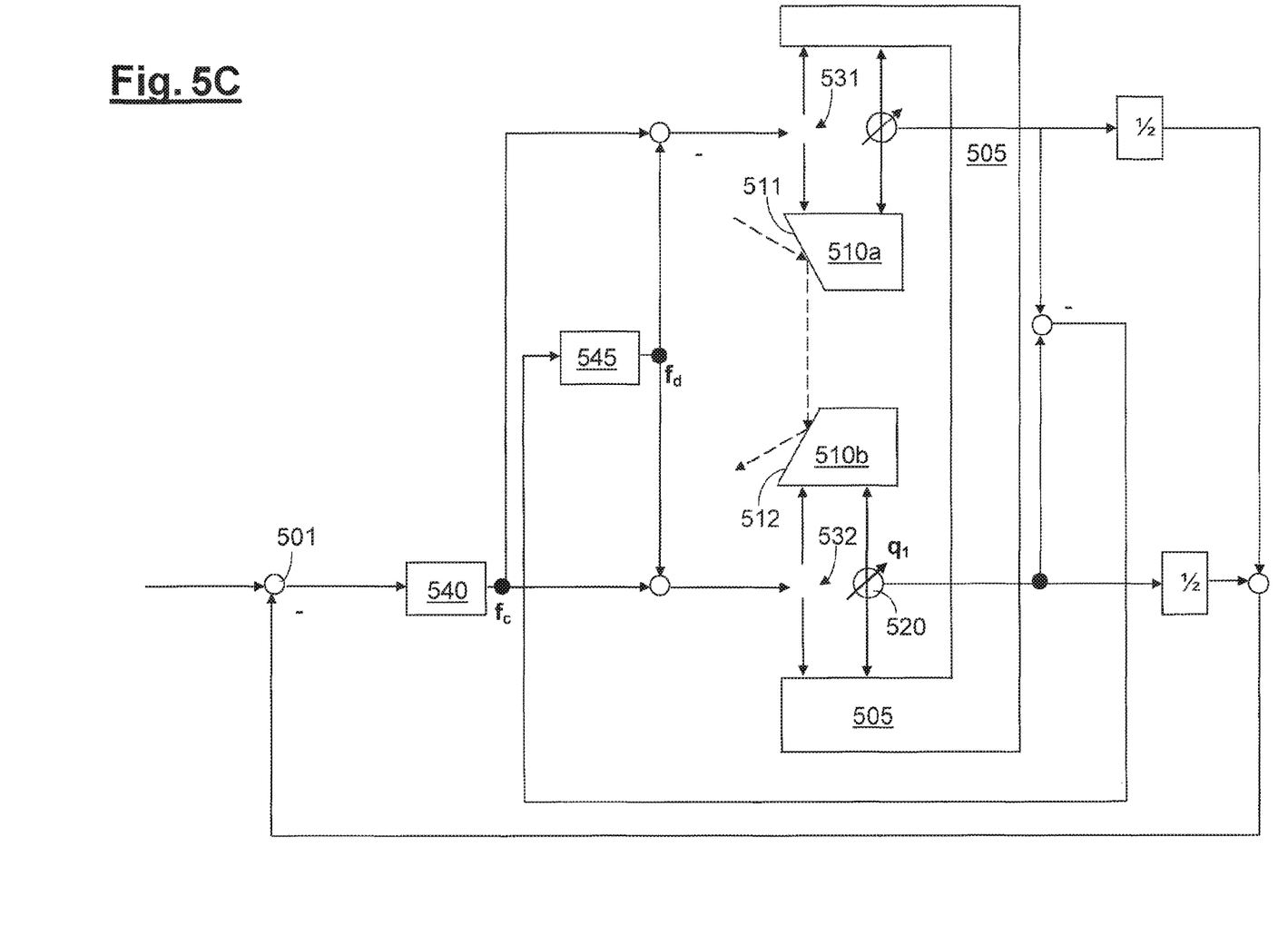

The embodiment of FIG. 5C differs from that of FIG. 4 insofar as the respective positions of each of the mirror bodies 510a and 510b are measured in relation to the outer frame 505. These measured positions are then used for both control loops, i.e. for the control loop with controller 540 controlling the common or average position of the mirror bodies 510a, 510b, and the control loop with controller 545 for controlling the relative position of the reflective surfaces 511 and 512 or mirror bodies 510a, 510b, respectively.

Figure 5D:
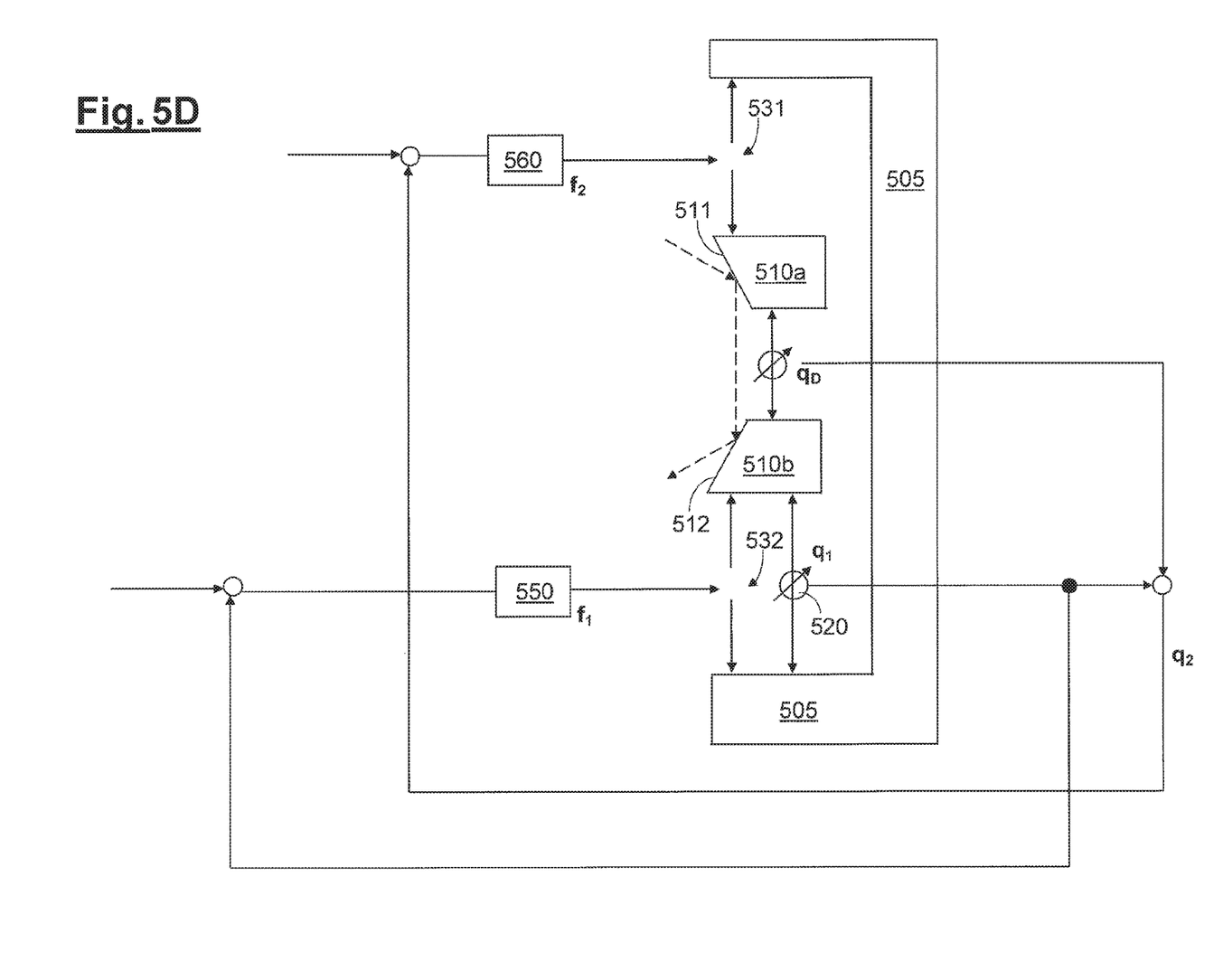

The embodiment according to FIG. 5D is similar to that of FIG. 4 insofar as what is measured is, on the one hand, the relative position of the two mirror bodies 510a and 510b, and on the other hand, the position of one mirror body 510b in relation to the outer frame 505. However, and different from FIG. 4, the positions of both mirror bodies 510*a* and 510*b* are controlled in separate control loops with controllers 550 or 560, respectively.

Figure 6:
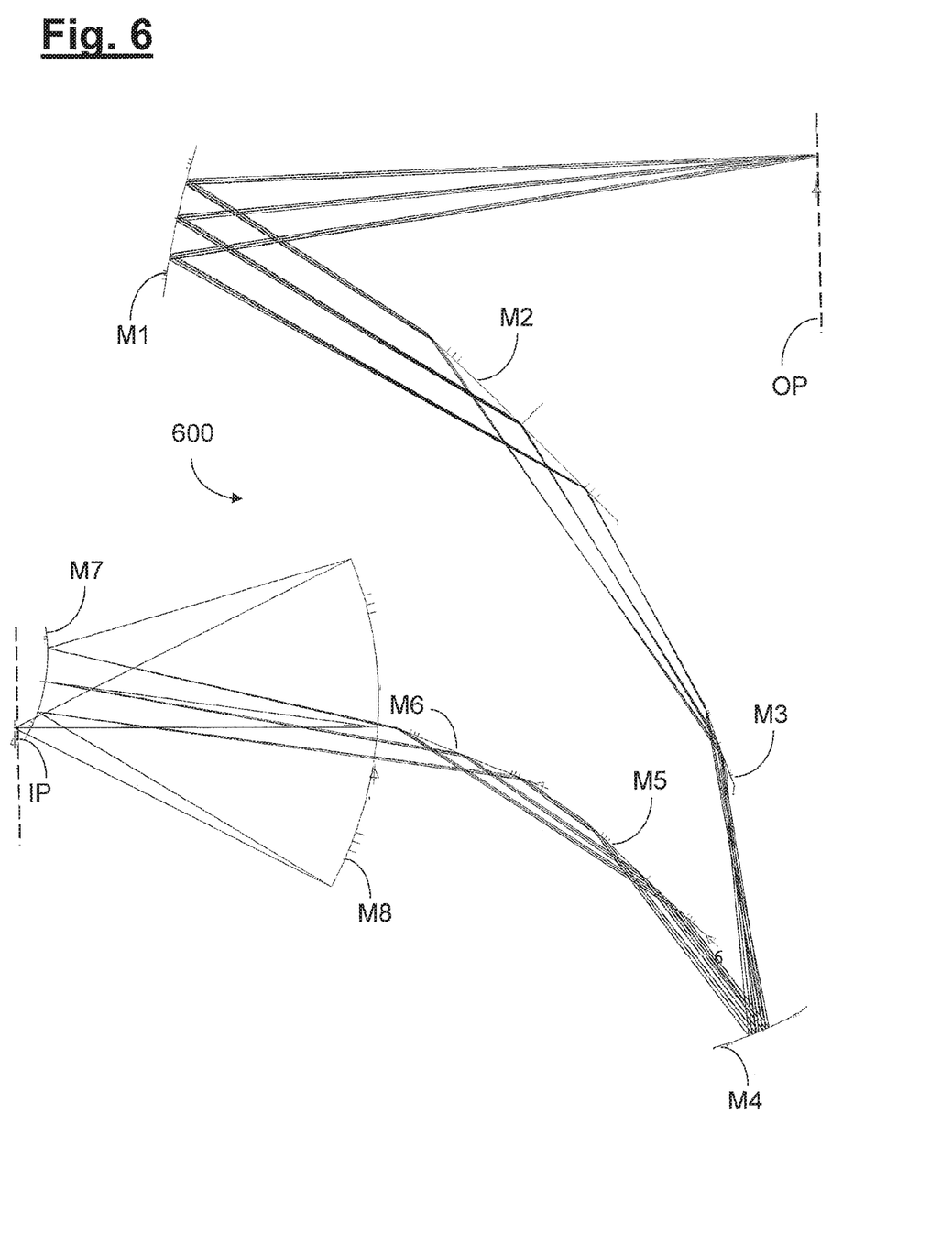
FIG. 6 shows a schematic illustration for elucidating an exemplary embodiment of a projection lens in which the present disclosure can be realized.

FIG. 6 shows an exemplary concrete set-up of a projection lens 600 in which the disclosure can be realized. However, the disclosure is not restricted to realization in a projection lens having the concrete set-up shown in FIG. 6. In further exemplary embodiments, the disclosure can also be realized in projection lenses having a different set-up (e.g. as disclosed in DE 10 2012 202 675 A1) or other optical systems. The projection lens 600 in accordance with the exemplary embodiment in FIG. 6 has eight mirrors M1 to M8, of which the mirrors M1, M4, M7 and M8 are embodied as mirrors for normal incidence of the illumination light (with an angle of incidence of less than 45°) and can include a reflection layer stack composed of molybdenum (Mo) and silicon (Si) layers. The mirrors M2, M3, M5 and M6 are embodied as mirrors for grazing incidence of the illumination light (with angles of incidence of greater than 60°) and can have a coating with, for example, a layer composed of molybdenum (Mo) or ruthenium (Ru).

Merely by way of example, the reflective surfaces kept stable with regard to their relative position according to the disclosure can be the optical effective surfaces of the mirrors M5 and M6 (with combination of two surfaces that are reflective under grazing incidence) or else the optical effective surfaces of the mirrors M3 and M4 (with combination of a surface that is reflective under grazing incidence with a surface that is reflective under substantially normal incidence).

Even though the disclosure has been described on the basis of specific embodiments, numerous variations and alternative embodiments are evident to the person skilled in the art, e.g. through combination and/or exchange of features of individual embodiments. Accordingly, it goes without saying for the person skilled in the art that such variations and alternative embodiments are concomitantly encompassed by the present disclosure, and the scope of the disclosure is restricted only within the meaning of the appended patent claims and the equivalents thereof.

What is claimed is:

1. An optical system having an optical beam path, the optical system comprising:
   a first mirror body supporting a first reflective surface;
   a second mirror body supporting a second reflective surface;
   a first sensor;
   a second sensor;
   a first control loop; and
   a second control loop,
   wherein:
      the first mirror body does not contact the second mirror body;
      the first reflective surface is in the optical beam path;
      the first reflective surface is configured so that, during operation of the optical system, the first reflective surface moves to correct an aberration;
      the second reflective surface is in the optical beam path;
      the first sensor is configured to: i) measure a position of the first reflective surface relative to a reference surface; and ii) produce sensor signals based on the position of the first reflective surface relative to the reference surface;
      the first control loop is configured to control, based on the sensor signals produced by the first sensor, the position of the first reflective surface relative a reference position;
      the second sensor is configured to: i) measure a position of the first reflective surface relative to a position of the second reflective surface; and ii) produce sensor signals based on the position of the first reflective surface relative to the position of the second reflective surface;
      the second control loop is configured to control, based on the sensor signals produced by the second sensor, the position of the first reflective surface relative to the position of the second reflective surface;
      the first sensor has a first sensitivity and a first measurement range;
      the second sensor has a second sensitivity and a second measurement range;
      the first sensitivity is less than the second sensitivity;
      the first measurement range is greater than the second measurement range;
      the optical system is configured so that, during movement of the first reflective surface, a relative position of the first and second reflective surfaces is maintained in a stable manner; and
      along the optical path, one of the following holds:
         there are no reflective surfaces between the first and second reflective surfaces; and
         only reflective optical elements are between the first and second reflective surfaces.

2. The optical system of claim 1, wherein, along the optical path, there are no reflective surfaces between the first and second reflective surfaces.

3. The optical system of claim 1, wherein, along the optical path, only reflective optical elements are between the first and second reflective surfaces.

4. The optical system of claim 1, wherein, during operation of the optical system, electromagnetic radiation is reflected at the first reflective surface at angles of at least 55° relative to a normal to the first reflective surface.

5. The optical system of claim 4, wherein, during operation of the optical system, electromagnetic radiation is reflected at the second reflective surface at angles of at least 55° relative to a normal to the first reflective surface.

6. The optical system of claim 1, wherein the first reflective surface is aspherical.

7. The optical system of claim 1, wherein the first reflective surface is configured to be moveable during the operation of the optical system.

8. The optical system of claim 1, wherein the optical system has an operating wavelength of less than 30 nm.

9. The optical system of claim 1, wherein the optical system is selected from the group consisting of an illumination device of a microlithographic projection exposure apparatus illumination device, and a projection lens of a microlithographic projection exposure apparatus.

10. An apparatus, comprising:
   an illumination device; and
   a projection lens configured,
   wherein:
      the illumination device is configured to illuminate a mask in an object plane of the projection lens;
      to image illuminated structures of the mask onto a light-sensitive layer situated in an image plane of the projection lens;
      the apparatus comprises an optical system according to claim 1; and the apparatus is a microlithographic projection exposure apparatus.

11. The optical system of claim 1, wherein the first mirror body is not mechanically rigidly connected to the second mirror body.

12. The optical system of claim 1, wherein the optical system is configured so that, during movement of the first reflective surface, a maximum change in an angle between the first and second surfaces is 16 picorad.

13. A method of using an optical system which comprises first and second reflective surfaces in an optical beam path of the optical system, the method comprising:
    moving the first reflective surface to correct of an aberration;
    when moving the first reflective surface, maintaining a relative position of the first and second reflective surfaces in a stable manner;
    using a first control loop to control, based on sensor signals produced by a first sensor, a position of the first reflective surface relative to relative to the reference position; and
    using a second control loop to control, based on sensor signals produced by a second sensor, a relative position of the first and second reflective surfaces,
    wherein:
        the first sensor has a first sensitivity and a first measurement range;
        the second sensor has a second sensitivity and a second measurement range;
        the first sensitivity is less than the second sensitivity;
        the first measurement range is greater than the second measurement range; and
        one of the following holds:
            the first and second reflective surfaces directly succeed one another in the optical beam path; and
            only reflective optical elements are between the first and second reflective surfaces along the optical beam path.

14. The method of claim 13, wherein the first mirror body does not contact the second mirror body.

15. The method of claim 13, wherein the first mirror body is not mechanically rigidly connected to the second mirror body.

16. The method of claim 13, wherein the optical system is configured so that, during movement of the first reflective surface, a maximum change in an angle between the first and second surfaces is 16 picorad.

17. An optical system having an optical beam path, the optical system comprising:
    a first mirror body supporting a first reflective surface;
    a second mirror body supporting a second reflective surface;
    a first sensor;
    a second sensor;
    a first control loop; and
    a second control loop,
    wherein:
        the first mirror body does not contact the second mirror body;
        the first reflective surface is in the optical beam path;
        the first reflective surface is configured so that, during operation of the optical system, the first reflective surface moves to correct an aberration;
        the second reflective surface is in the optical beam path;
        the first sensor is configured to: i) measure a position of the first reflective surface relative to a reference surface; and ii) produce sensor signals based on the position of the first reflective surface relative to the reference surface;
        the first control loop is configured to control, at least partially based on the sensor signals produced by the first sensor, a common position of the first and second reflective surfaces relative the reference position;
        the second sensor is configured to: i) measure a position of the first reflective surface relative to a position of the second reflective surface; and ii) produce sensor signals based on the position of the first reflective surface relative to the position of the second reflective surface;
        the second control loop is configured to control, based on the sensor signals produced by the second sensor, the position of the first reflective surface relative to the position of the second reflective surface;
        the first sensor has a first sensitivity and a first measurement range;
        the second sensor has a second sensitivity and a second measurement range;
        the first sensitivity is less than the second sensitivity;
        the first measurement range is greater than the second measurement range;
        the optical system is configured so that, during movement of the first reflective surface, a relative position of the first and second reflective surfaces is maintained in a stable manner; and
        along the optical path, one of the following holds:
            there are no reflective surfaces between the first and second reflective surfaces; and
            only reflective optical elements are between the first and second reflective surfaces.

18. The optical system of claim 17, wherein the optical system is configured so that, during movement of the first reflective surface, a maximum change in an angle between the first and second surfaces is 16 picorad.

19. An optical system having an optical beam path, the optical system comprising:
    a first mirror body supporting a first reflective surface;
    a second mirror body supporting a second reflective surface;
    a first sensor;
    a second sensor;
    a first control loop; and
    a second control loop,
    wherein:
        the first mirror body does not contact the second mirror body;
        the first reflective surface is in the optical beam path;
        the first reflective surface is configured so that, during operation of the optical system, the first reflective surface moves to correct an aberration;
        the second reflective surface is in the optical beam path;
        the first sensor is configured to: i) measure a position of the first reflective surface relative to a reference surface; and ii) produce sensor signals based on the position of the first reflective surface relative to the reference surface;
        the second sensor is configured to: i) measure a position of the first reflective surface relative to a position of the second reflective surface; and ii) produce sensor signals based on the position of the first reflective surface relative to the position of the second reflective surface;

the first control loop is configured to control, based on the sensor signals produced by the first sensor the position of the first reflective surface relative a reference position;

the second control loop is configured to control, based on the sensor signals produced by the first sensor and the sensor signals produced by the second sensor, the position of the second reflective surface relative a reference position;

the first sensor has a first sensitivity and a first measurement range;

the second sensor has a second sensitivity and a second measurement range;

the first sensitivity is less than the second sensitivity;

the first measurement range is greater than the second measurement range;

the optical system is configured so that, during movement of the first reflective surface, a relative position of the first and second reflective surfaces is maintained in a stable manner; and along the optical path, one of the following holds:
  there are no reflective surfaces between the first and second reflective surfaces; and
  only reflective optical elements are between the first and second reflective surfaces.

20. The optical system of claim 19, wherein the optical system is configured so that, during movement of the first reflective surface, a maximum change in an angle between the first and second surfaces is 16 picorad.

* * * * *

UNITED STATES PATENT AND TRADEMARK OFFICE
CERTIFICATE OF CORRECTION

PATENT NO. : 10,838,306 B2  
APPLICATION NO. : 15/968270  
DATED : November 17, 2020  
INVENTOR(S) : Ulrich Schoenhoff Page 1 of 1

It is certified that error appears in the above-identified patent and that said Letters Patent is hereby corrected as shown below:

On the Title Page

Item (57), (Abstract), Line 2, before "system" delete "22";

In the Claims

Column 10, Line 3, Claim 1, after "relative" insert -- to --;

Column 11, Line 21 (Approx.), Claim 13, delete "relative to relative to" and insert -- relative to --;

Column 12, Line 7 (Approx.), Claim 17, after "relative" insert -- to --;

Column 13, Line 3, Claim 19, after "relative" insert -- to --;

Column 13, Line 8 (Approx.), Claim 19, after "relative" insert -- to --.

Signed and Sealed this  
Second Day of February, 2021

Drew Hirshfeld  
*Performing the Functions and Duties of the*  
*Under Secretary of Commerce for Intellectual Property and*  
*Director of the United States Patent and Trademark Office*